United States Patent [19]
Harris et al.

[11] Patent Number: 5,831,292
[45] Date of Patent: Nov. 3, 1998

[54] IGBT HAVING A VERTICAL CHANNEL

[75] Inventors: Christopher Harris, Sollentuna; Andrei Konstantinov, Linköping; Erik Janzén, Borensburg, all of Sweden

[73] Assignee: ABB Research Ltd., Zurich, Switzerland

[21] Appl. No.: 637,304

[22] Filed: Apr. 24, 1996

[51] Int. Cl.⁶ .................. H01L 29/74; H01L 31/0312; H01L 31/111
[52] U.S. Cl. ..................... 257/139; 257/77; 257/153
[58] Field of Search .................. 257/77, 139, 144, 257/147, 341, 153

[56] References Cited

U.S. PATENT DOCUMENTS

| | | | |
|---|---|---|---|
| 4,851,888 | 7/1989 | Ueno | 257/139 |
| 5,393,999 | 2/1995 | Malhi | 257/77 |

Primary Examiner—Wael Fahmy
Attorney, Agent, or Firm—Pollock, Vande Sande & Priddy

[57] ABSTRACT

A transistor of SiC having an insulated gate comprises a drain contact with a highly doped substrate layer formed on the drain. The substrate layer is of p-type or of n-type. For a p-type transistor, a highly doped n-type buffer layer may optionally be formed on top of the substrate layer. A low doped n-type drift layer, a highly doped p-type base layer, a highly doped n-type source region, and a source contact are then superimposed on the substrate layer. A vertical trench extends through the source region and the base layer to at least the drift layer. The trench has a wall next to these layers. A gate electrode extends vertically along the wall and at least over a vertical extension of the base layer. An insulating layer is arranged between the gate electrode and at least the base layer whereby an inversion channel is formed for electron transport from the source contact to the drain contact. An additional low doped p-type layer is arranged in the channel region laterally to the base layer, between the base layer and the insulating layer. The additional layer extends vertically over at least the base layer.

6 Claims, 2 Drawing Sheets

IGBT HAVING A VERTICAL CHANNEL

TECHNICAL FIELD

The present invention relates to a transistor of SiC having an insulated gate and comprising one of a) a MISFET and b) an IGBT, the transistor comprising, superimposed in the order mentioned, a drain, a highly doped substrate layer being for a) of n-type and for b) of p-type, for b) on top thereof one of c) a highly doped n-type buffer layer and d) no such layer, a low doped n-type drift layer, a p-type base layer, a highly doped n-type source region layer and a source. The transistor further comprises a vertical trench extending through the source region layer and the base layer and at least to the drift layer and having a lateral wall next to these layers. Also, the transistor comprises a gate electrode extending vertically along the wall at least over the vertical extension of the base layer and an insulating layer arranged between the gate electrode and at least the base layer, for, upon applying a voltage to the gate electrode, forming a conducting inversion channel at the interface of the SiC to the insulating layer to transport electrons from the source to the drain. This invention also relates to a method for producing such a transistor.

BACKGROUND OF THE INVENTION

Such transistors of SiC may especially be used as switching devices in power applications, where they are very advantageous, since it is possible to turn them on and off very fast.

Such transistors made of SiC as semiconductor material are especially well suited for high power applications, since, if it were possible to fully benefit from the inherent properties of SiC, namely the capability of SiC to function well under extreme conditions, such devices would be superior to devices made of Si for high power applications. Besides the possible high operation temperatures of devices fabricated from SiC and the high thermal conductivity of SiC, SiC also has a more than five times higher breakdown field than Si, so that it is well suited as a material in high power devices operating under conditions where high voltages may occur in the blocking state of a device. An IGBT made of this material will have particularly low conduction losses in the on-state compared to a MISFET, but the invention comprises within its scope also such MISFET's.

A major example of drawbacks for IGBTs already known arises from the fact that an IGBT has three pn-junctions in series and thereby a thyristor-like structure. This results in problems with so called "latch-up" in the on-state. This problem as well as other drawbacks related thereto and also to MISFET's of this type, will now be explained while referring to FIG. 1 of the appended drawings. This illustrates a prior art IGBT having superimposed a drain 1', a highly doped p-type substrate layer 2' for forming a good ohmic contact to the drain, a highly doped n-type buffer layer 3', a low doped n-type drift layer 4', a p-type base layer 5', a highly doped n-type source region layer 6' and a source 7'. The device also has a trench 8' carried out through the source region layer and the base layer, and into the drift layer. A wall 9' of the trench is covered with an insulating layer 11'. The insulating layer and the bottom 10' of the trench are covered with a gate electrode 12' on top thereof. By applying a positive voltage above a threshold voltage value to the gate electrode 12', a conducting inversion channel, i.e. an n-type channel, may be created in the base layer 5' at the interface between the base layer 5' and the insulating layer 11' for conduction of electrons from the source region layer 6' to the drift layer 4' and for turning the device on. The device may very fast be turned off by cutting off the voltage supply to the gate electrode.

This is the normal operation of the IGBT, but this function is only there within a so called safe operating area (SOA); outside this area, the following mechanism will appear. Since an IGBT has a highly doped p-type substrate layer 2', the electron current flowing through the inversion channel and towards the drain will cause a substantial hole injection from the substrate layer 2' into the drift layer 4'. The holes move across the drift layer, taking a variety of paths, and reach the base layer 5', and they will move towards the source 7' for recombining with electrons from the source. Some of these holes will take paths having a partially lateral extension, and these holes will feel a lateral spreading resistance of the base layer which, in its turn, results in a lateral voltage drop in the base layer along the junction between the base layer 5' and the source region layer 6'. This tends to forward bias the junction and, if the voltage drop is large, enough substantial injection of electrons from the source region layer into the base layer will occur and a parasitic thyristor composed of the two parasitic npn- and pnp-transistors created in this way will latch on, and a "latch-up" of the IGBT has then occurred. Once the IGBT is in latchup, the gate no longer has any control of the drain current. The IGBT may then only be turned off in the same way as a conventional thyristor. If the latchup is not terminated quickly, the IGBT will be destroyed by excessive power dissipation. There is a critical value of drain current which will cause a large enough lateral voltage drop to activate the thyristor. Thus, this will result in a severe restriction of the safe operating area of such an IGBT, so that the advantageous features of SiC, especially the ability to withstand high temperatures and the high thermal conductivity thereof, may not be utilized as desired for high power applications.

One possible solution to this problem is to keep the p-base resistance low, i.e. by highly doping the base layer, so that the safe operating area of the device may be extended and higher drain currents may be allowed. However, this solution presents severe problems to the formation of an inversion channel at the interface between the insulating layer and the base layer, since the threshold voltage value to be exceeded will be very high and accordingly limit the charge carrier mobility in the channel and thereby increase the on-state resistance of the device. A MISFET does not suffer from the latch-up mechanism described above, however, because there is also a trade off in doping level of the p base layer. The restriction of doping density imposed by threshold voltage and channel mobility implies that the base layer need necessarily be thicker to support the high voltage.

SUMMARY OF THE INVENTION

The object of the present invention is to provide a transistor of the type defined in the introduction, in which the drawback mentioned above is reduced to a large extent.

This object is obtained by providing such a transistor with an additional low doped p-type layer arranged laterally to the base layer, connecting it to the insulating layer and extending vertically, at least over the extension of the base layer, and by making the base layer highly doped.

The low doping concentration of the additional layer, in which a vertical conducting inversion channel will be formed upon applying a voltage to the gate electrode, allows a low necessary gate voltage, i.e. threshold voltage value, to produce the inversion channel. Thus, this low doping implies a higher channel mobility and hence a larger possible forward current. The base layer may therefore be highly doped without any negative influence upon the on-state losses of the device, so that the base layer may be given a low resistivity extending the safe operating area of the device to higher drain currents, i.e. the operation area in which the thyristor action of the device is prevented. These advantages are equally applicable to both an IGBT and a MISFET.

"Highly doped" and "low doped" are, in connection with the base layer and the lateral layer, respectively, to be interpreted broadly and to cover all cases in which the doping concentration of the lateral layer is substantially lower than the doping concentration of the base layer. Accordingly, these claim definitions only state that this relation is present.

According to another preferred embodiment of the invention, the trench extends into the drift layer. This facilitates the proper application of the gate electrode while still ensuring a passivating isolation of the trench bottom.

A further object of the invention is to provide a method for producing a transistor of SiC having an insulated gate and being one of a) a MISFET and b) an IGBT, for which the drawback mentioned of prior art transistors is considerably reduced.

This object is, in accordance with the invention, obtained by providing such a method comprising the steps of:

1) epitaxially growing on top of each other the following semiconductor layers of SiC: a highly doped p-type substrate layer being for a) of n-type and for b) of p-type, for b) on top thereof one of c) a highly doped n-type buffer layer and d) no such layer, a low doped n-type drift layer and a highly doped p-type base layer, 2) etching at least through the base layer for forming a trench having a wall extending vertically, 3) epitaxially growing an additional low doped p-type layer on the wall at least over the vertical extension of the base layer, 4) one of a) implanting n-type dopants in the additional layer for forming a highly doped n-type source region layer therein and b) epitaxially growing such a source region layer on top of the additional layer, 5) applying an insulating layer with a gate electrode thereon on the additional layer at least over the vertical extension of the base layer and a source on the source region layer.

This object is also obtained by providing such a method comprising the steps of:

1) epitaxially growing on top of each other the following semiconductor layers of SiC: a highly doped substrate layer being of a) of n-type and for b) of p-type, for b) on top thereof one of c) a highly doped n-type buffer layer and d) no such layer, a low doped n-type drift layer, a highly doped p-type base layer, and a highly doped n-type source region layer, 2) etching at least through the source region layer and the base layer for forming a trench having a wall extending vertically, 3) epitaxially growing an additional low doped p-type layer on the wall at least over the vertical extension of the base layer, 4) applying an insulating layer with a gate electrode thereon on the additional layer at least over the vertical extension of the base layer and a source on the source region layer.

The use of lateral regrowth in this way to produce the additional low doped layer, in which the conducting channel is created is the key to obtaining a transistor having the preferred properties discussed above. This lateral regrowth also means that the SiC surface forming the interface to the insulating layer is created by epitaxial growth and will thereby have a considerably lower density of traps with respect to prior art transistors having an insulated gate, in which the interface is provided by a surface created through etching, so that the mobility of charge carriers in the channel will be increased and thereby the on-state losses be reduced.

BRIEF DESCRIPTION OF THE DRAWING

With reference to the appended drawing, below follows a specific description of preferred embodiments of the invention cited as examples.

In the drawings.

DETAILED DESCRIPTION OF THE PREFERRED EMBODIMENT(S)

Figure 1:
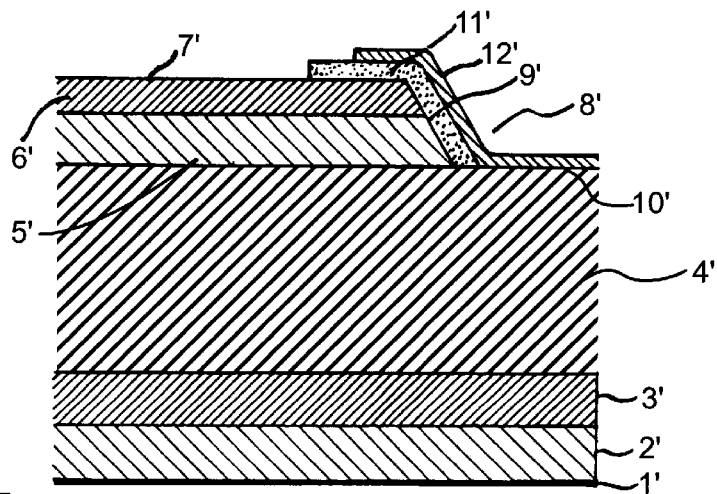
FIG. 1 is a schematic cross-sectional view of an IGBT according to the prior art.
Figure 2:
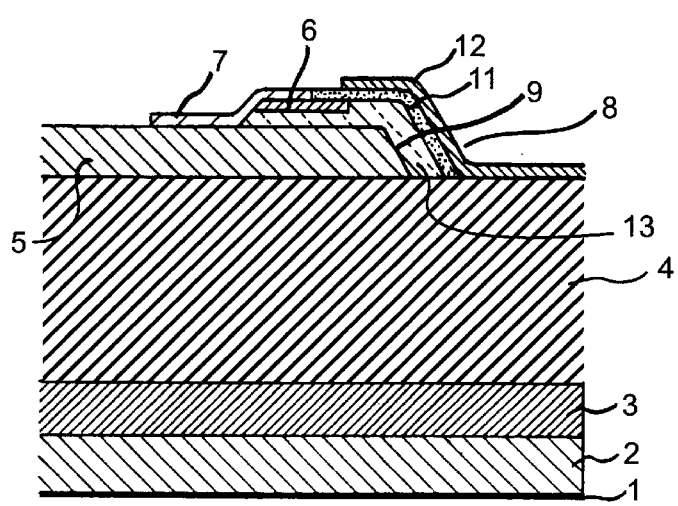
FIG. 2 is a cross-sectional view corresponding to that of FIG. 1 of an IGBT according to a first preferred embodiment of the present invention.

FIG. 2 illustrates an insulated gate bipolar transistor (IGBT) according to a first preferred embodiment of the invention, and the parts corresponding to the parts of the prior art transistor described above are provided with the same reference numerals with the index ' removed, so that the transistor has superimposed a drain 1; a highly doped p-type substrate layer 2 for forming good ohmic contact to the drain; a highly doped n-type buffer layer 3 arranged for preventing a reach-through of the depletion layer to the substrate layer (this layer is optional); a low dope n-type drift layer 4; a p-type base layer 5, which here is highly doped; a highly doped n-type source region layer 6; and a source 7. A trench 8 is carried out by etching through the source region layer and the base layer and into the drift layer. An additional low doped p-type layer 13 is epitaxially grown, preferably by the CVD-technique, on a wall 9 of the trench and here also on top of a part of the base layer. The source region layer is located on a lateral part of this additional layer, possibly formed by carrying out an implantation step in the additional layer 13. An insulating layer 11, for example of $SiO_2$, is applied in the trench on the additional layer 13. Finally, a gate electrode 12, preferably of poly-crystalline silicon, is applied on the insulating layer.

The function of the insulated gate bipolar transistor according to FIG. 2 is as follows: upon application of a voltage over a certain threshold voltage level on the gate electrode 12, a vertical conducting inversion channel will be created at the interface between the additional low doped layer 13 and the insulating layer 11 for transport of electrons between the source region layer 6 and the drift layer 4 and to turn the transistor on if a forward bias is applied over the source and drain thereof. Thus, an electron flow from the source 7 to the drain 1 will result. This electron flow will cause hole injection from the substrate layer 2 into the drift layer 4. These holes will try to reach the source for recombining with the electrons thereof. These holes will reach the base layer 5, which because of to the high doping thereof will have a low resistivity, so that the movement of these holes in partial lateral paths in the base layer will cause only low voltage drops in the lateral direction along the source region layer. Furthermore, only a low positive voltage has to be applied to the gate for creating the inversion channel as a consequence of the low doping of the additional layer 13, in which the inversion channel is created. This means a high mobility in the inversion channel and low on-state losses of the device, which situation is further improved by the fact that the layer 13 is formed by a lateral regrowth, which means that the surface thereof will be of a higher quality, i.e. have a lower trap density, than an etched surface. Accordingly, because of the low doping of the additional layer 13, the base layer may be highly doped without causing any problem with a high threshold voltage value.

The doping concentration of the lateral layer 13 may be as low as $10^{15}$ cm$^{-3}$, or even lower, and the doping concentration of the base layer may be as high as $10^{19}$–$10^{21}$ cm$^{-3}$, but the invention is not in any way restricted to these figures.

Figure 3:
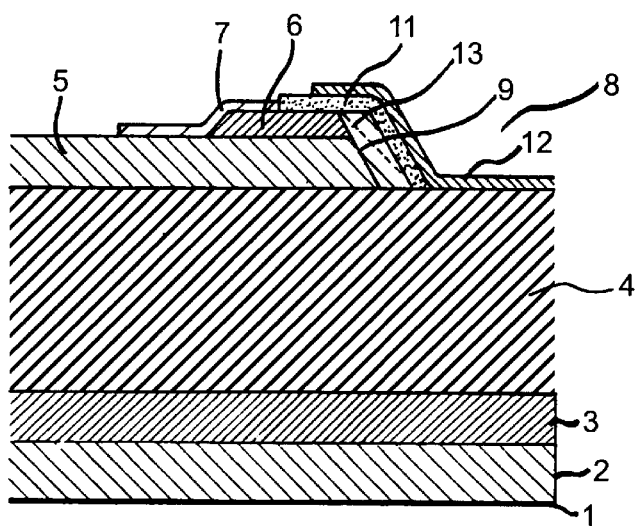
FIG. 3 is a cross-section view corresponding to FIG. 2 of an IGBT according to a second preferred embodiment of the invention.

FIG. 3 shows an IGBT according to a second preferred embodiment of the invention, which differs from that shown in FIG. 2 in that the trench 8 was carried out after the epitaxial growth of the base layer 5, and the source region layer 6 and the layer 13 was then grown on the wall 9 formed by the base layer and the source region layer 6. The remaining steps for producing this IGBT are the same as for the IGBT according to FIG. 2. The function of this IGBT will also be substantially the same as of the one shown in FIG. 2, but FIG. 3 is only shown to indicate that the embodiment shown in FIG. 2 may be varied in different ways within the scope of the invention.

Figure 4:
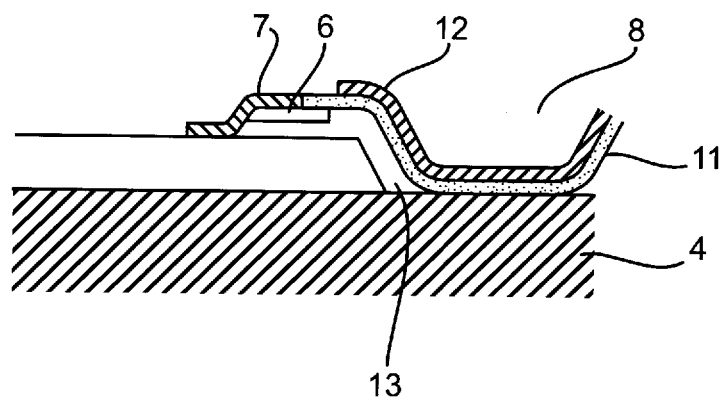
FIG. 4 is a cross-sectional view of an IGBT according to a third preferred embodiment of the invention.

FIG. 4 shows a third preferred embodiment of the invention. This embodiment differs from FIG. 2 in that the insulating layer 11 is formed to cover substantially the entire trench 8.

Figure 5:
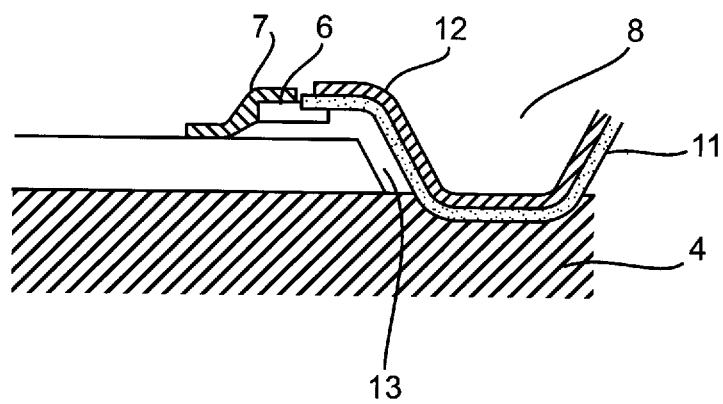
FIG. 5 is a cross-sectional view of an IGBT according to a fourth preferred embodiment of the invention.

FIG. 5 shows a fourth preferred embodiment of the invention. The fourth embodiment differs from FIG. 4 in that trench 8 is formed to extend into the drift layer 4.

The invention is of course not in any way restricted to the preferred embodiments described above, but many possibilities to modifications thereof will be apparent to a man skilled in the art without departing from the basic idea of the invention.

It is emphasized that the thicknesses of the different layers in the Figures cannot be interpreted as limiting the scope of protection, but any thickness relations are intended to be covered by the claims.

Furthermore, the definition of "superimposed" in the claims is to be interpreted broadly and means that there is a contact in the vertical direction between such subsequent layers.

The dopants used may be of any material suitable as dopants for this application.

The independent patent claims concerning the methods for producing an insulated gate bipolar transistor do, of course, not include every step necessary for producing such a transistor, but several conventional steps of semiconductor producing technologies will also be used.

"Trench" as defined in the claims only means that a part of the semiconductor layers of SiC is etched away, but such a "trench" does not necessarily have to have a bottom with a considerable extension. Furthermore, "vertical" means that the vertical component of the direction in question is substantially larger than the horizontal component.

The number of layers mentioned in the claims is a minimum number, and it is within the scope of the invention to arrange further layers in the devices or dividing any layer into several layers by selective doping of different regions thereof.

"Substrate layer" is in this disclosure to be interpreted as the layer closest to the drain of the layers mentioned and is not to be limited to a substrate layer in the strict sense of this word within this field, i.e. the layer from which the growth is started. The real substrate layer may be any of the layers and is mostly the thickest one, which may be the drift layer.

The method claims are to be interpreted as not restricted to a growth of the layers located on top of each other in the order they are mentioned, but any other order of growth of these layers is whithin the scope of the claims. For instance, the method may be started from the drift layer and the so called substrate layer and the drain may be grown at the very end of the method.

We claim:

1. A transistor of SiC having an insulated gate and being one of a) a MISFET and b) an IGBT, said transistor comprising superimposed, in the order mentioned, a drain contact, a highly doped substrate layer of either a) n-type or b) p-type and in the case of b), either a highly doped n-type buffer layer or no said highly doped n-type buffer layer formed on said highly doped substrate layer, a low doped n-type drift layer, a p-type base layer, a highly doped n-type source region layer and a source contact, said transistor further comprising a vertical trench extending through the source region layer and the base layer and at least to said drift layer and having a wall next to these layers, said transistor further comprising a gate electrode extending vertically along said wall at least over a vertical extension of said base layer and an insulating layer arranged between the gate electrode and at least said base layer, for, upon applying a voltage to the gate electrode, forming a conducting inversion channel at the interface to said insulating layer for electron transport from the source to the drain, and an additional low doped p-type layer arranged in the channel region of said device laterally to the base layer, between the base layer and the insulating layer and extending vertically at least over said vertical extension of the base layer, and wherein said base layer is highly doped.

2. A transistor according to claim 1, wherein said trench extends into said drift layer.

3. A transistor according to claim 1, wherein said insulating layer and the gate electrode extend over substantially the entire wall of the trench.

4. A transistor according to claim 1, wherein said insulating layer covers substantially the entire trench.

5. A transistor according to claim 1, wherein said additional p-type layer extends vertically over substantially an entire extension of the trench.

6. A transistor of SiC having an insulated gate, said transistor comprising, superimposed on each other:

a drain contact;

a highly doped substrate layer formed on said drain, said substrate layer being one of p-type or n-type and, for p-type either a) a highly doped n-type buffer layer or b) no said highly doped n-type buffer layer formed thereon;

a low doped n-type drift layer;

a highly doped p-type base layer;

a highly doped n-type source region;

a source contact;

a vertical trench extending through said source region and said base layer at least to said drift layer, said trench having a wall;

a gate electrode extending vertically along said wall and at least over a vertical extension of said base layer;

an insulating layer arranged between said gate electrode and at least said base layer, whereby an inversion channel is formed for electron transport from said source contact to said drain contact;

an additional low doped p-type layer arranged in a channel region laterally to said base layer, between said base layer and said insulating layer, said additional layer extending vertically over at least said base layer.

* * * * *